United States Patent [19]
Hicks

[11] Patent Number: 5,119,759
[45] Date of Patent: Jun. 9, 1992

[54] APPARATUS FOR SOLDER NOZZLE HEIGHT SENSING

[75] Inventor: Christopher A. Hicks, Austin, Tex.

[73] Assignee: International Business Machines Corporation, Armonk, N.Y.

[21] Appl. No.: 586,653

[22] Filed: Sep. 24, 1990

[51] Int. Cl.$^5$ .............................................. B05C 1/02
[52] U.S. Cl. .................................... 118/712; 118/323; 118/669; 73/1 J; 73/4 R; 409/186; 409/187; 409/194; 408/10; 408/11
[58] Field of Search ............... 118/669, 712, 323, 415, 118/697; 156/64, 356, 357; 73/1 D, 1 J, 4 R; 408/10, 11, 16; 409/186, 187, 193, 194; 901/41, 42, 43, 46, 47

[56] References Cited

U.S. PATENT DOCUMENTS

| | | | |
|---|---|---|---|
| 3,143,041 | 8/1964 | Nameny-Katz | 409/218 |
| 3,809,308 | 5/1974 | Roeder et al. | 228/9 |
| 4,425,061 | 1/1984 | Kindl et al. | 409/218 X |
| 4,661,368 | 4/1987 | Rohde et al. | 427/8 |
| 4,745,557 | 5/1988 | Pekar et al. | 408/10 X |
| 4,762,578 | 8/1988 | Burgin, Jr. et al. | 156/64 |
| 4,898,117 | 2/1990 | Ledermann et al. | 118/690 X |
| 4,914,460 | 4/1990 | Caimi et al. | 901/47 X |
| 4,969,107 | 11/1990 | Mizuntani | 901/47 X |

Primary Examiner—W. Gary Jones
Assistant Examiner—Todd J. Burns
Attorney, Agent, or Firm—Andrew J. Dillon

[57] ABSTRACT

The method and apparatus of the present invention permit the accurate sensing of the height of a solder nozzle above a circuit board during operation of the solder nozzle. A non-contact limit switch, which provides an indication of the presence of a planar surface at a preselected proximity, is mounted in a fixed relationship with a solder nozzle which is manipulatable by means of a robotic arm. A reference surface is provided which includes a proximity sensor, such as a through beam fiber optic switch. The proximity sensor is mounted a predetermined distance above the reference surface and is utilized to detect the solder nozzle as it is moved toward the reference surface. By noting the position coordinates of the robotic arm at which the proximity sensor indicates the presence of the solder nozzle at the predetermined distance above the reference surface, and the position of the robotic arm at which the non-contact limit switch closes in response to the proximity of the reference surface, it is possible to accurately calculate a calibration offset value which may be utilized in conjunction with the output of the non-contact limit switch to precisely position the solder nozzle at a desired distance above a circuit board.

8 Claims, 1 Drawing Sheet

APPARATUS FOR SOLDER NOZZLE HEIGHT SENSING

BACKGROUND OF THE INVENTION

1. Technical Field

The present invention relates in general to the field of automated solder deposition systems and in particular to an improved apparatus and method for depositing solder onto solder wettable contact pads on a circuit board. Still more particularly, the present invention relates to a method and apparatus for accurately maintaining a tool at a desired height above a circuit board or other planar member.

2. Description of the Related Art

Solder distribution onto mounting pads for surface mount boards has generally been accomplished in the semiconductor industry utilizing a screening process. In a screen process artwork and screens must be fabricated having the solder deposition pattern. Then, a precision alignment process is carried out wherein the solder is screened onto the surface mount pads. The solder paste used for this process requires a substantially long cure and bake time. Thus, in addition to the necessary complexity of the alignment process, this prior art technique is relatively time consuming.

The prior art solder distribution technique utilizing screening is further complicated by a requirement that the pattern mix very fine lead pitch and width surface mound pads along with standard surface mount pads. For example, in the case of tape automated bonding, the pitches vary from four to twenty mils, while standard surface mount parts have pitches in the range of twenty to fifty mils. Thus, this process requires that different amounts of solder be distributed on various parts of the board. Given the precision required, it is common to utilize separate screening steps, one for very fine lead pitch and width surface mount parts and a second for the standard surface mount parts. There is also a possibility of damaging the solder deposited in a previous step when multiple screening operations are carried out. Additionally, screening fine line solder presents a problem because the solder paste tends to stick in the openings of the screen, as the openings get progressively narrower.

The prior art also discloses other techniques for depositing solder across the surface of a printed circuit. Dip soldering and wave soldering are both techniques which are known in the prior art. Wave soldering involves pumping a molten solder through a nozzle to form a standing wave. In this process, the entire side of an assembly containing printed conductors with the leads from the circuit components projecting through various points generally travels at a predetermined rate of speed over the standing surface of the wave of molten solder. The lower surface of the assemblies is placed into contact with the upper fluid surface of the wave.

By this technique, the solder wave in the first instance wets the joining surfaces and promotes through hole penetration. This in turn helps to assure the formation of reliable solder joints and fillets. Wave soldering is illustrated in U.S. Pat. Nos. 3,705,457 and 4,360,144. An example of an immersion technique is illustrated in U.S. Pat. No. 4,608,941 wherein panels are immersed in a liquid solder bath and then conveyed to an air knife which levels the molten solder on the panels. The air knife is therefore used to effectively clear the panels of excess solder and only the printed patterns retain the solder.

Another example of a solder leveler is contained in U.S. Pat. No. 4,619,841. The technique disclosed therein is used in conjunction with dip soldering techniques. Other techniques of selective deposition of solder onto printed circuit patterns are described in U.S. Pat. Nos. 4,206,254, 4,389,771 and 4,493,856.

U.S. Pat. No. 3,661,638 is also directed to a system for leveling and controlling the thickness of a conductive material on the walls of through-holes of a printed circuit board. That technique for removing the excess amount of conductive material employs heating to melt a conductive material after it has been deposited. Then, while the conductive material is in a plastic state, gyrating the board to cause the plastic material to move circumferentially about the through-hole and flow axially through the through-hole.

More recently, several techniques have been proposed which utilize a solder nozzle which deposits solder onto solder wettable contact pads in substantially uniform amounts on each pad. The tool utilized with such a nozzle generally comprises a solder reservoir or plenum, a heating element to melt the solder, and at the bottom of the reservoir, a foot which contains the nozzle and which passes over the contact pads to be wetted with solder. Examples of these types of systems are disclosed in U.S. Pat. No. 4,898,117, filed Apr. 15, 1988, entitled "Solder Deposition System" and U.S. Pat. No. 5,042,708, filed of even date herewith entitled "Solder Placement Nozzle Assembly."

Methods utilized to adjust the height of a solder nozzle, such as those described in the abovereferenced patent applications, are completely manual and typically utilize mechanical shims or feeler gauges of known thicknesses to measure the height between the tip of the solder nozzle and the circuit board or planar member upon which solder is to be deposited. Simple trial and error techniques were then utilized to adjust the nozzle height until it was within a desired range. This technique is quite time consuming and expensive.

A problem which exists with such systems is that the utilization of tools which contact the soldering nozzle and the surface to be soldered generally cause flux to be forced out from between the solder nozzle and the surface to be soldered, resulting in flux covered set up tools and the spreading of flux onto the soldering nozzle and the surface being soldered. Another problem which exists with such systems is that the surface being soldered varies in thickness and flatness and therefore tool height needs to be measured at each solder application point.

The environment near a solder nozzle is generally filled with flux, flux vapor, molten solder, solder oxides and solder vapor and as a result attempts at utilizing contact sensors to ensure proper solder nozzle height have been generally unsuccessful.

It should therefore be apparent that a need exists for a method and apparatus which permits the accurate and efficient adjustment of a solder nozzle height in a solder deposition system.

SUMMARY OF THE INVENTION

It is therefore one object of the present invention to provide an improved automated solder deposition system.

It is another object of the present invention to provide an improved method and apparatus for depositing solder onto solder wettable contact pads on a circuit board.

It is yet another object of the present invention to provide an improved method and apparatus for accurately maintaining a solder nozzle at a desired height above a circuit board.

The foregoing objects are achieved as is now described. The method and apparatus of the present invention permit the accurate sensing of the height of a solder nozzle above a circuit board during operation of the solder nozzle. A non-contact limit switch, which provides an indication of the presence of a planar surface at a preselected proximity, is mounted in a fixed relationship with a solder nozzle which is manipulatable by means of a robotic arm. A reference surface is provided which includes a proximity sensor, such as a through beam fiber optic switch. The proximity sensor is mounted a predetermined distance above the reference surface and is utilized to detect the solder nozzle as it is moved toward the reference surface. By noting the position coordinates of the robotic arm at which the proximity sensor indicates the presence of the solder nozzle at the predetermined distance above the reference surface, and the position of the robotic arm at which the non-contact limit switch closes in response to the proximity of the reference surface, it is possible to accurately calculate a calibration offset value which may be utilized in conjunction with the output of the non-contact limit switch to precisely position the solder nozzle at a desired distance above a circuit board. In one preferred embodiment of the present invention, the solder nozzle is repeatedly moved toward the reference surface during calibration to ensure that the calibration offset value obtained is statistically significant.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
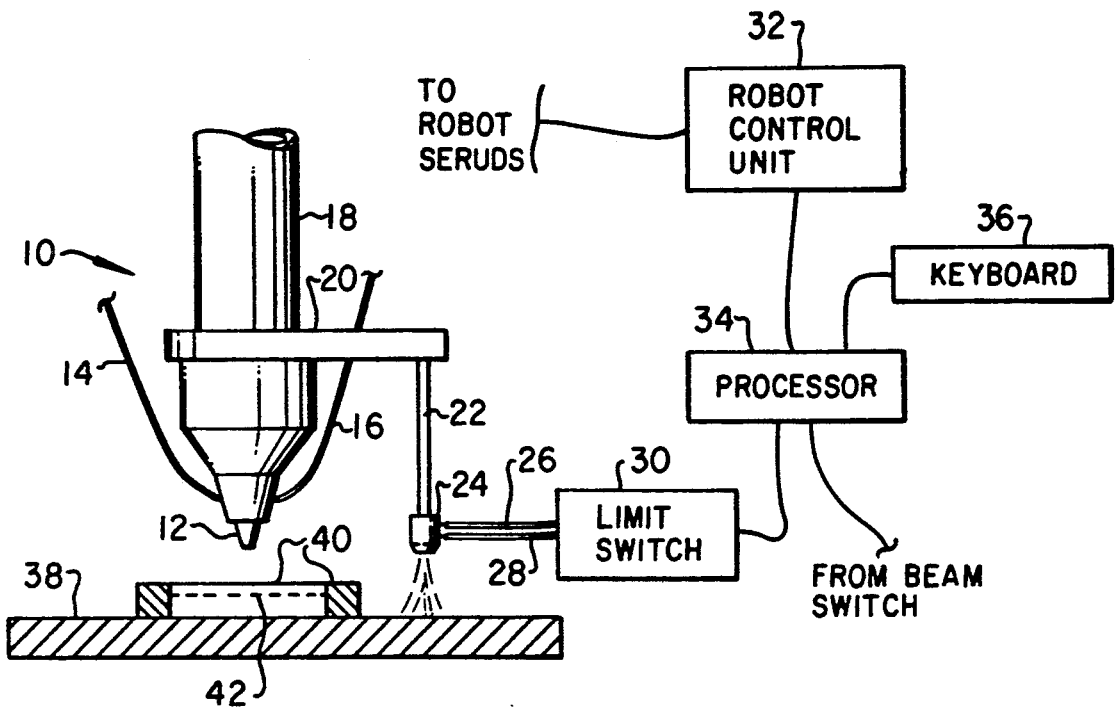
FIG. 1 is a partially schematic, side view of the solder nozzle height sensor system of the present invention.

With reference now to the figures and in particular with reference to FIG. 1, there is depicted a partially schematic side view of the solder nozzle height sensor system of the present invention. As is illustrated, a solder deposition system 10 is depicted which includes a solder nozzle 12 and a plurality of supply tubes 14 and 16. As those skilled in the art will appreciate, supply tubes 14 and 16 may be utilized to supply inert gas or flux, as well as solder into a heated plenum to form a molten mass of solder. Solder nozzle 12 is then preferably moved over a plurality of wettable contacts on the surface of a circuit board or other planar member, such that a uniform amount of solder is deposited on each wettable contact.

Solder nozzle 12 is preferably mounted to robotic arm 18, which is manually or electronically manipulatable under the control of an operator or a properly programmed robot control unit, such as robot control unit 32. As is illustrated, robot control unit 32 preferably provides a plurality of electronic signals which are coupled to various servos and motors which are utilized to manipulate robotic arm 18. In this manner, solder nozzle 12 may be accurately and efficiently moved throughout a preprogrammed path above the surface of a circuit board or other planar member. Of course, variations in the thickness of a circuit board make it imperative that a means be provided to accurately adjust the height of solder nozzle 12 above the surface of a circuit board, so that the amount of solder deposited on the wettable contacts thereon is uniform and of desired thickness.

In accordance with an important feature of the present invention, a rigid bracket 20 is also mounted to robotic arm 18 in conjunction with solder nozzle 12. Rigid bracket 20 is preferably formed of a metallic material or other highly rigid substance and serves as a mounting point for mounting member 22. As is illustrated, mounting member 22 is preferably mounted in a downward direction from rigid bracket 20 and is generally oriented parallel to the axis of solder nozzle 12.

At the lowermost end of mounting member 22 is a pneumatic switch nozzle 24. Pneumatic switch nozzle 24 is utilized, in the depicted embodiment of the present invention, as a non-contact limit switch and operates on principles well known to those skilled in the art of such limit switches. A flow of oxygen, nitrogen, or other suitable gas is preferably coupled to pneumatic switch nozzle 24 by means of pneumatic supply lines 26 and 28 and is focused, utilizing nozzles or other techniques, onto the surface of a planar member toward which solder nozzle 12 is manipulated.

As pneumatic switch nozzle 24 reaches a predetermined proximity to a planar member, such as reference surface 38, variations in the pressure of the gaseous material flowing through pneumatic switch nozzle 24 are detected by limit switch 30 and may be utilized to accurately indicate the presence or absence of a planar member within a preselected proximity.

Pneumatic switch nozzle 24 and its associated limit switch 30 may be obtained commercially. One such product is marketed by the Nippon Pneumatic/Fluidics Systems Company, Ltd., as Model No. DAS-05-05. In the depicted embodiment of the present invention, the preselected proximity setting of pneumatic switch nozzle 24 is typically set to 0.040 inches. This distance is detectable to within an accuracy of plus or minus 0.0015 inches, utilizing the device discussed above.

As is illustrated, the output of limit switch 30 is coupled to processor 34. Processor 34 may be any suitably programmed microprocessor based device which may be utilized in conjunction with robot control unit 32 and keyboard 36 to perform the rudimentary mathematical calculations necessary to achieve a desired solder nozzle height.

Still referring to FIG. 1, a reference surface 38 is provided. Mounted thereon is a calibration jig 40. Calibration jig 40 is preferably a semi-circular or horseshoe shaped apparatus which encloses a gap, across which is provided an optic beam 42. In a manner which will be explained in greater detail herein, optic beam 42 is directed from one side of calibration jig 40 to the other side and crosses the aperture therebetween at a predetermined distance above the upper surface of reference surface 38.

Figure 2:
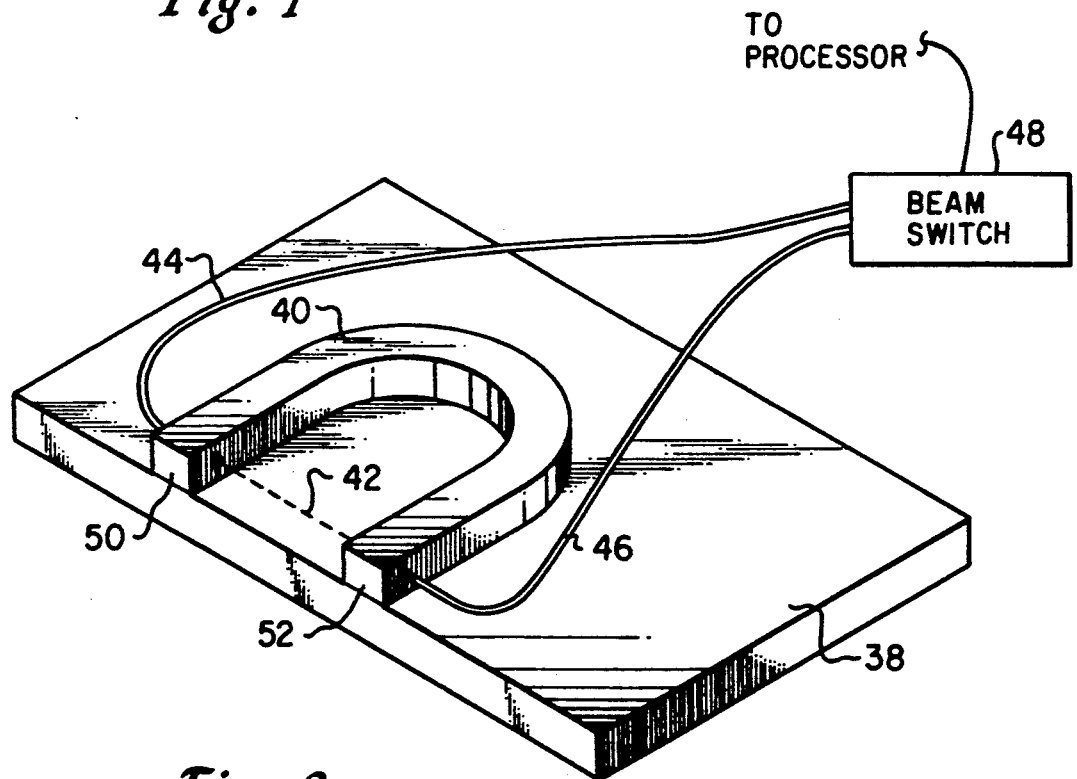
FIG. 2 is a partially schematic perspective view of a reference surface and calibration jig which may be utilized in the solder nozzle height sensor system of the present invention.

Referring now to FIG. 2, there is depicted a partially schematic perspective view of reference surface 38 and a calibration jig 40, which may be utilized in the solder nozzle height sensor system of the present invention. As is illustrated, optic beam 42 is preferably provided by utilizing a plurality of fiber optic cables, such as fiber optic cable 44 and fiber optic cable 46. Apertures are drilled through calibration jig end 50 and calibration jig end 52 of a sufficiently small diameter so that the diameter of optic beam 42 is small enough to register the presence of solder nozzle 12 within a desired degree of accuracy. In the depicted embodiment of the present invention, the diameter of optic beam 42 is preferably 0.3 millimeters or smaller, leading to a capability of detecting the presence of solder nozzle 12, within an accuracy of plus or minus 0.0005".

As is illustrated, fiber optic cables 44 and 46 are both coupled to beam switch 48. Beam switch 48 preferably includes a light source for generating optic beam 42, which is coupled to one of the fiber optic cables depicted. The presence or absence of the beam being returned by means of the other fiber optic cable is then utilized to close or open a solid-state switching device. The output of beam switch 48 is then preferably coupled to processor 34 (see FIG. 1).

Referring now to both FIGS. 1 and 2, the calibration procedure which is utilized with the solder nozzle height sensor system of the present invention will be illustrated. First, solder deposition system 10 is energized and solder nozzle 12 is brought up to operational temperatures. Those skilled in the art will appreciate that it is important to raise solder nozzle 12 to its actual operating temperature utilized during solder deposition, so that errors induced by thermal expansion or contraction of the material which forms solder nozzle 12 or the mounting brackets therefore may be substantially reduced. Thereafter, robotic arm 8 is utilized to move solder nozzle 12 at a speed Which is substantially equal to the speed which will be utilized during actual solder deposition technique.

Next, solder nozzle 12 and its associated pneumatic switch nozzle 24 are moved downward toward the upper surface of reference surface 38. Robot control unit 32, in conjunction with processor 34 and beam switch 48 are then utilized to stop the movement of solder nozzle 12 when optic beam 42 is interrupted, indicating the presence of solder nozzle 12 at a predetermined distance above the upper surface of reference surface 38. The position of solder nozzle 12, as determined by robot control unit 32 is then stored.

Next, solder nozzle 12 is once again urged toward the upper surface of reference surface 38, until such time as a variation in the pressure of the gas flow being emitted from pneumatic switch nozzle 24 indicates that the upper surface of reference surface 38 is within a preselected proximity to pneumatic switch nozzle 24. At this point, limit switch 30 associated therewith closes, and sends a signal to processor 34, which is utilized to stop the movement of robotic arm 18. The position Of solder nozzle 12, as determined by robot control unit 32 is then once again recorded.

Next, in accordance with an important feature of the present invention, these two preceding steps are repeated a number of times and each new value for the position of solder nozzle 12 at the locations where optic beam 42 has been interrupted and when pneumatic switch nozzle 24 indicates the presence of the upper surface reference surface 38 at a preselected proximity are stored. Thereafter, these values are statistically averaged and a standard deviation is calculated to permit the system to determine whether or not the average values obtained are statistically significant.

Finally, a calibration offset value, which may be utilized to automatically measure the offset from solder nozzle 12 to pneumatic electric nozzle 24, is calculated. This calibration offset value is, quite simply, the average position of solder nozzle 12 when optic beam 42 is interrupted, less the position of solder nozzle 12 at the point when pneumatic switch nozzle 24 indicates the presence of the upper surface of reference surface 38 at a predetermined proximity, less the predetermined height of optic beam 42 above the upper surface of reference surface 38. This calibration offset value is then stored and may be utilized to accurately determine the height of solder nozzle 12, in a manner which will be described below.

The automatic positioning of solder nozzle 12 at a selected distance above a surface to be soldered is now accomplished following a procedure which will be discussed herein. Once again, after raising the temperature of solder nozzle 12 to an operating level and setting the speed of solder nozzle 12 to that which Will be utilized during normal soldering operations, solder nozzle 12 and pneumatic switch nozzle 24 are urged toward the surface to be soldered. Robot control unit 32 is then utilized to stop the downward motion of solder nozzle 12 when the variation in pressure within pneumatic switch nozzle 24, as detected in limit switch 30, indicates that pneumatic switch nozzle 24 is within a predetermined proximity to the upper surface of the circuit board to be soldered.

The location of solder nozzle 12 at this point, as sensed by robot control unit 32, is recorded. Next, an operator enters a desired solder offset height, via keyboard 36, and robot control unit 32 then adjusts the height of solder nozzle 12 by calculating a location corresponding to the desired height. This is accomplished by adding the robot location indicated when pneumatic switch nozzle 24 indicates the presence of a circuit board at a preselected proximity to the desired solder height offset and the offset calibration value previously calculated.

In this manner, a desired solder nozzle offset from the upper surface of a circuit board may be accurately and efficiently maintained without the utilization of a contact switch. By providing a non-contact limit switch, such as pneumatic switch nozzle 24 and, in accordance with the method and apparatus of the present invention, accurately determining the calibration offset value which exists between the height of solder nozzle 12 and the height of pneumatic switch nozzle 24 it is possible to accurately position solder nozzle 12. This calibration offset value may be rapidly and efficiently calculated by processor 34 and thereafter utilized by robot control unit 32 to automatically adjust the height of solder nozzle 12 to a desired level.

In view of the fact that this technique utilizes non-contact switching, it performs well in the highly volatile environment which generally exists near a soldering nozzle. Attempts at utilizing contact sensors to determine the height of a solder nozzle above a circuit board have generally met with failure due to the fact that such sensors quickly become contaminated in this hostile environment. By utilizing a non-contact pneumatic-electric switch, such as that comprising pneumatic switch nozzle 24 and limit switch 30, the system becomes self-cleaning in that a constant, low flow rate of oxygen, air or nitrogen passes through pneumatic switch nozzle 24, constantly cleaning the aperture. Testing with this system has proven that defect rates may be lowered dramatically with this technique.

While the invention has been particularly shown and described with reference to a preferred embodiment, it will be understood by those skilled in the art that various changes in form and detail may be made therein without departing from the spirit and scope of the invention. For example, this system will work well in any robotic system in which a drill or liquid dispenser must be brought to within a precisely selected height above a planar member which is contaminated by dust and/or corrosive gasses which would render a contact sensor inaccurate.

I claim:

1. A tool height sensing apparatus for utilization in a system having a tool mounted to a manipulatable robotic arm and adapted to be urged forward toward the surface of a planar member, said apparatus comprising:
   a non-contact limit switch adapted to generate an indication when said limit switch is brought into a preselected proximity to a planar member;
   means for mounting said non-contact limit switch in a fixed relationship with said tool;
   a reference surface having a proximity sensor mounted a fixed distance above said reference surface, said proximity sensor for generating a reference signal in response to the presence of said tool at said fixed distance above said reference surface;
   manipulator means for urging said tool toward said reference surface; and
   control means coupled to said manipulator means, said proximity sensor and said non-contact limit switch for generating a calibration offset value for utilization in adjusting the height of said tool above a planar member utilizing said non-contact limit switch, wherein variations in said fixed relationship between said non-contact limit switch and said tool may be accommodated.

2. The tool height sensing apparatus according to claim 1, wherein said non-contact limit switch comprises a pneumatic-electric switch.

3. The tool height sensing apparatus according to claim 2, wherein said pneumatic-electric switch includes means for directing a gaseous flow at a planar member and means for detecting a variation in the pressure of said gaseous flow in response to said pneumatic-electric switch being brought into said preselected proximity to said planar member.

4. The tool height sensing apparatus according to claim 1, wherein said means for mounting said non-contact limit switch comprises a bracket mounted to said tool wherein said non-contact limit switch is fixedly mounted in a parallel relationship with said tool.

5. The tool height sensing apparatus according to claim 1, wherein said tool comprises a solder nozzle adapted to dispense heated solder onto the surface of said planar member.

6. The tool height sensing apparatus according to claim 5, further including means for heating said solder nozzle prior to urging said solder nozzle toward said reference surface wherein solder nozzle position errors induced as a result of thermal expansion during operation of said system are substantially eliminated.

7. The tool height sensing apparatus according to claim 1, wherein said proximity sensor comprises a through beam fiber optic switch disposed within a semicircular mount.

8. The tool height sensing apparatus according to claim 1, wherein said manipulator means repeatedly urges said tool toward said reference surface and wherein said control means includes means for calculating an average calibration offset value.

* * * * *